United States Patent [19]

Ohara

[11] Patent Number: 5,404,141
[45] Date of Patent: Apr. 4, 1995

[54] SIGNAL CONVERTING APPARATUS UTILIZING AN ANALOG-DIGITAL CONVERTING SECTION AND A DIGITAL-ANALOG CONVERTING SECTION

[75] Inventor: Eiji Ohara, Kawasaki, Japan
[73] Assignee: Canon Kabushiki Kaisha, Tokyo, Japan
[21] Appl. No.: 240,218
[22] Filed: May 9, 1994

Related U.S. Application Data

[63] Continuation of Ser. No. 653,291, Feb. 8, 1991, abandoned.

[30] Foreign Application Priority Data

Feb. 15, 1990 [JP] Japan .................................. 2-32401

[51] Int. Cl.[6] ............................................ H03M 1/02
[52] U.S. Cl. .................................... 341/110; 341/155; 341/108
[58] Field of Search ................ 341/110, 108, 144, 145, 341/155, 156; 375/26

[56] References Cited

U.S. PATENT DOCUMENTS

| | | | |
|---|---|---|---|
| 4,348,768 | 9/1982 | Svala | 341/108 X |
| 4,875,048 | 10/1989 | Shimizu et al. | 341/156 |
| 5,043,821 | 8/1991 | Suga et al. | 358/213.29 |

*Primary Examiner*—Brian K. Young
*Attorney, Agent, or Firm*—Fitzpatrick, Cella, Harper & Scinto

[57] ABSTRACT

There is provided a signal converting apparatus using a semiflash type A/D converter comprising an analog-digital (A/D) converting section and a digital-analog (D/A) converting section, wherein the apparatus has an input switching circuit for switching in a manner such that an input of the D/A converting section is set to a conversion output of the A/D converting section during the A/D converting operation and the input of the D/A converting section is set to an external input during the D/A converting operation.

12 Claims, 2 Drawing Sheets

SIGNAL CONVERTING APPARATUS UTILIZING AN ANALOG-DIGITAL CONVERTING SECTION AND A DIGITAL-ANALOG CONVERTING SECTION

This application is a continuation of application Ser. No. 07/653,291, filed Feb. 8, 1991, now abandoned.

BACKGROUND OF THE INVENTION

1. Field of the Invention

The present invention relates to a signal converting apparatus comprising a D/A (digital-analog) converter and an A/D (analog-digital) converter.

2. Related Background Art

Hitherto, various related background arts have been known as such a kind of apparatus. As an example, a serial/parallel type A/D converter which is used in a system of a whole solid state camera is shown in FIG. 1 together with peripheral circuits. In the diagram, reference numeral 1 denotes a clamp circuit; 2 a sample and hold (S/H) circuit; 3a a serial/parallel type A/D (analog-digital) converter; and 4, 5a, 6, and 7 an A/D converter of the upper a bits parallel type, an a bits D/A (digital-analog) converter, a differential amplifier, and an A/D converter of the lower b bits parallel type which are component elements of the serial/parallel type A/D converter 3a, respectively. Reference numeral 8 denotes a digital signal processing circuit; 9 a memory circuit; and 5b an (a+b) bits D/A converter.

The operation will now be described.

An input video signal is processed by the clamp circuit 1 and the sample and hold circuit 2 and becomes the video signal adapted as an input signal of the serial/parallel type A/D converter 3a. The video signal is converted into the digital video signal by the A/D converter 3a. The A/D converter 3a comprises: the two A/D converters 4 and 7 of the parallel comparison type; the a bits D/A converter 5a; and the differential amplifier 6. The A/D converter 3a is the well-known typical serial/parallel type A/D converter. Since the a bits D/A converter 5a is concerned with an accuracy of the A/D converter 3a, an accuracy of (a+b) bits or more is obviously required for D/A converter 5a. The A/D converted digital video signal is subjected to a digital signal process such as an image encoding or the like by the DSP (digital signal processing) circuit 8, and thereafter, it is controlled by a write control signal and stored into the memory circuit 9.

The digital video signal which was controlled by a read control signal and was read out of the memory circuit 9 is subjected to a process such as an image decoding or the like which is opposite to the above process by the DSP circuit 8. After that, the processed digital video signal is converted into the analog video signal by the (a+b) bits D/A converter 5b and generated.

However, in the above conventional example, it is necessary to provide two highly accurate D/A converters 5a and 5b. There are problems when a plurality of sets each comprising the serial/parallel type A/D converter 3a and D/A converter 5b are integrated; for instance, it is disadvantageous from viewpoints of the chip size, electric power consumption, and costs.

SUMMARY OF THE INVENTION

The invention is made to solve such problems and it is an object of the invention to provide a signal converting apparatus which can reduce the number of D/A converters including the peripheral circuits and can also reduce the chip size, electric power consumption, and costs upon integration.

To accomplish the above object, according to the invention, a signal converting apparatus is constructed as shown in embodiments (1) to (4).

(1) A signal converting apparatus using a semiflash type A/D converter comprising an angalog/digital (A/D) converting section and a digital/analog (D/A) converting section, comprising input switching means for switching in a manner such that an input of the D/A converting section is set to a conversion output of the A/D converting section during the A/D converting operation, and the input of the D/A converting section is set to an external input during the D/A converting operation.

(2) A signal converting apparatus which has a D/A converter and a plurality of A/D converters and A/D or D/A converts an input signal and output a converted signal, wherein an input of the D/A converter is selectively switched to a conversion output of a predetermined one of the A/D converters or an external input. When the input is switched to the conversion output, the conversion output of the D/A converter is supplied to the input side of the remaining A/D converters, and when the input is switched to the external input, the conversion output of the D/A converter is generated through an output terminal.

(3) A signal converting apparatus comprising: A/D converters for A/D converting upper bits and lower bits of an input signal in parallel, respectively; a D/A converter for generating a conversion output to an output terminal or an input side of one of the A/D converters; and switching means for selectively switching an input of the D/A converter to a conversion output of the other A/D converter or an external input.

(4) A signal converting apparatus according to the above item (3), wherein a quantization level of the D/A converter is switched to the sum of the upper and lower bits or either one of the upper bits and the lower bits in accordance with the kind of the input of the D/A converter.

In items (1) to (3) described above, the signal converting apparatus functions as both of the A/D converting apparatus and the D/A converting apparatus, and thus the number of independent D/A converters can be reduced.

The above objective and features of the present invention will become apparent from the following detailed description and the appended claims with reference to the accompanying drawings.

DETAILED DESCRIPTION OF THE PREFERRED EMBODIMENTS

Figure 1:
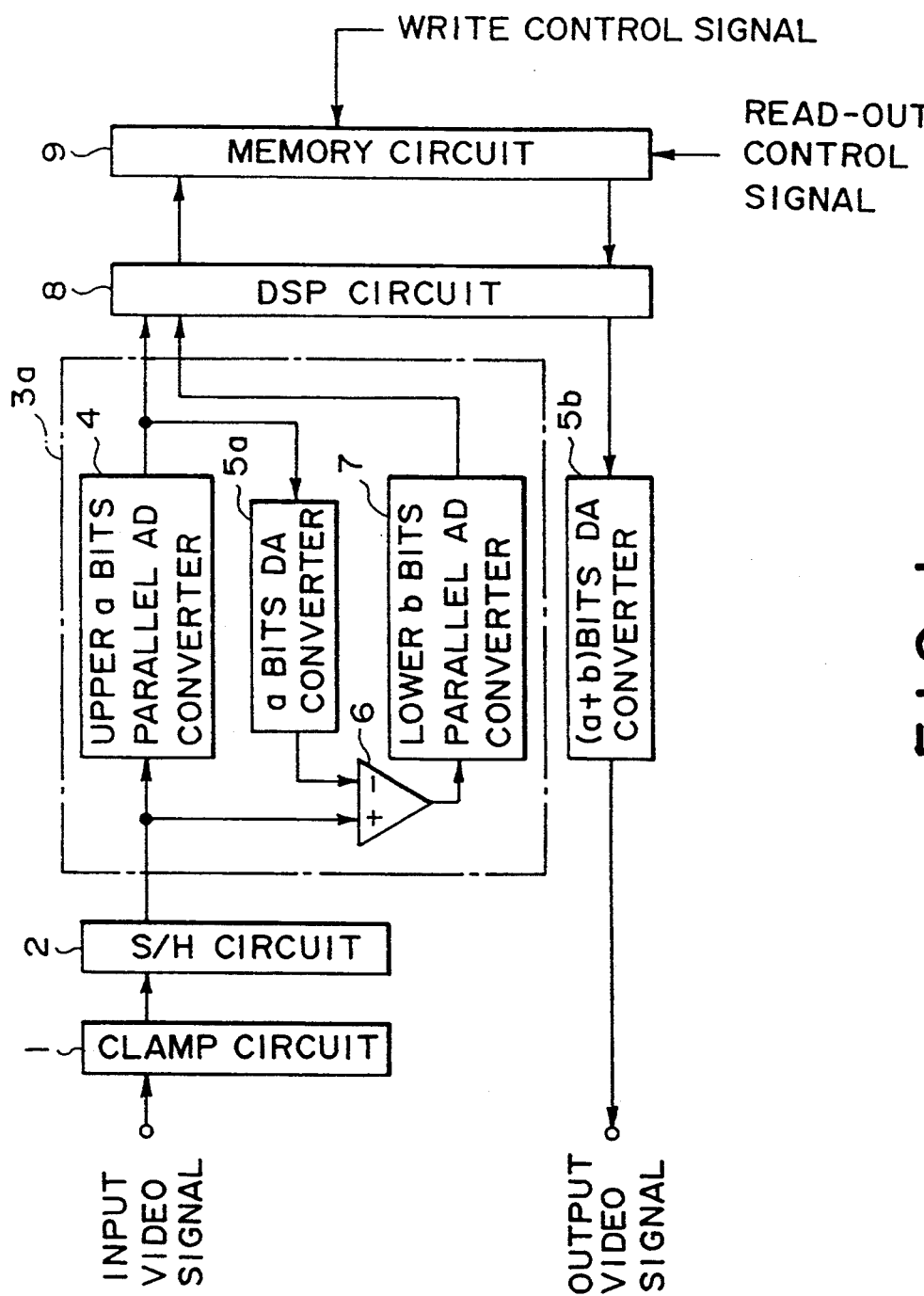
FIG. 1 is a system block diagram of a whole solid state camera using A/D converters in a conventional example.
Figure 2:
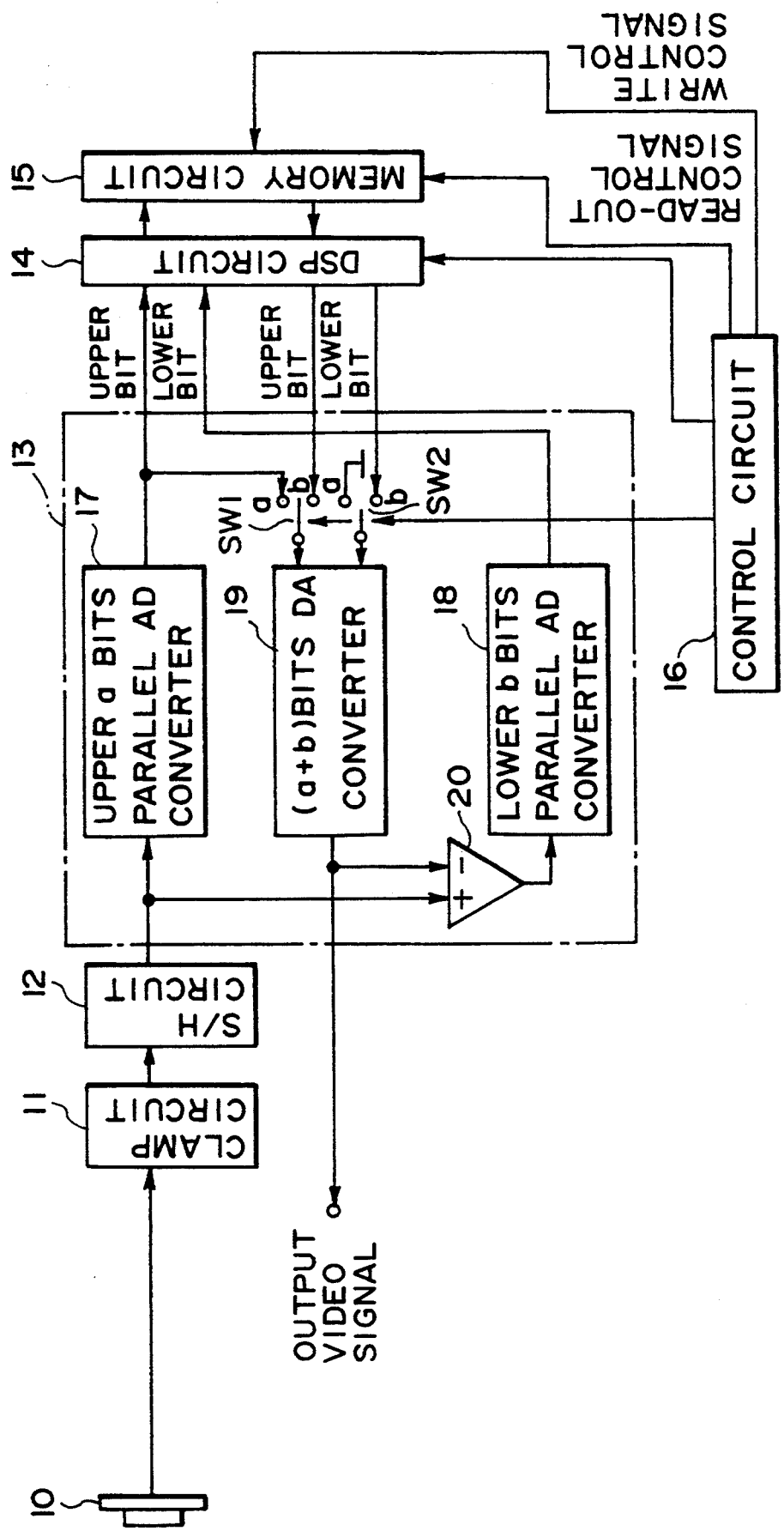
FIG. 2 is a system block diagram of a whole solid state camera using an A/D converting apparatus of an embodiment according to the invention.

An embodiment of a signal converting apparatus according to the invention will be described in detail below with reference to FIG. 2.

The embodiment relates to the case where the signal converting apparatus according to the invention is applied to a whole solid state camera. The signal converting apparatus functions as an A/D converter in the recording (image recording) mode and functions as a D/A converter in the reproducing mode.

In the embodiment, an image pickup output obtained from an image pickup device 10 using a CCD or the like is clamped to a predetermined level by a clamp circuit 11. The clamped signal is sampled and held by a sample and hold (S/H) circuit 12, so that a video signal is derived.

The video signal is supplied to a signal converting apparatus 13 and converted into the digital signal. The digital video signal is subjected to general signal processes such as image encoding, compression, addition of an error correction code, and the like by a DSP circuit 14. The DSP circuit 14 is coupled to the control circuit 16 with a signal line. The processed signal is stored into a memory circuit 15.

The signal converting apparatus 13, DSP circuit 14, and memory circuit 15 are controlled by a switch change-over control signal, a write control signal, a read control signal, and the like which are supplied from a control circuit 16, respectively.

The signal converting apparatus 13 comprises: an upper a bits parallel A/D converter 17; a lower b bits parallel A/D converter 18; an (a+b) bits D/A converter 19; a differential amplifier 20; and switches SW$_1$ and SW$_2$. A differential output of an input video signal and an output of the D/A converter 19 is supplied to the lower b bits parallel A/D converter 18.

Either an output of the upper a bits parallel A/D converter 17 or a reproduction video signal from the DSP circuit 14 is selected by the switches SW$_1$ and SW$_2$ and supplied to the D/A converter 19.

The switches SW$_1$ and SW$_2$ are switched by the switch change-over control signal which is supplied from the control circuit 16.

The operation will now be described.

The video signal is generated from the CCD 10 is processed by the clamp circuit 11 and the sample and hold circuit 12 into the video signal which is suitable as an input signal of the signal converting apparatus 13. The processed video signal is supplied to the signal converting apparatus 13.

When writing the signal into the memory circuit 15, that is, when the signal converting apparatus 13 performs the A/D converting operation, the change-over switches SW$_1$ and SW$_2$ in the signal converting apparatus 13 are switched to the side of an a terminal by the switch change-over control signal controlling the switches SW$_1$ and SW$_2$. Since the a terminal on the side of lower bits of the D/A converter 19 is connected to the ground and fixed, the D/A converter 19 operates as an a bits D/A converter. Thus, the signal converting apparatus 13 functions as an (a+b) bits serial/parallel A/D converter and converts the video signal into the digital video signal of (a+b) bits. The A/D converted digital video signal is subjected to a digital signal processes such an image encoding and the like by the DSP circuit 14. After that, the processed video signal is controlled by a write control signal comprising a write clock, a write address signal, and the like and is stored into the memory circuit 15.

The digital video signal which was controlled by the read control signal comprising the read clock, read address signal, and the like and was read out of the memory circuit 15 is subjected to processes such as an image decoding and the like which are opposite to the foregoing processes by the DSP circuit 14. After that, the processed signal is supplied to the signal converting apparatus 13.

When the signal is read out of the memory circuit 15, the change-over switches SW$_1$ and SW$_2$ in the signal converting apparatus 13 are switched to the side of a b terminal by the switch change-over control signal. Thus, the D/A converter 19 operates as an (a+b) bits D/A converter. The digital video signal is converted into the analog video signal by the (a+b) bits D/A converter 19 and is generated. That is, at this time, the signal converting apparatus 13 merely functions as a D/A converter of (a+b) bits.

As mentioned above, in the serial/parallel type signal converting apparatus 13, there is provided the switching means for switching in a manner such that the input signal of the D/A converter 19, as a component element of the signal converting apparatus 13, is set to either the conversion output of the A/D converter 17 or the readout signal from the memory circuit 15. The signal converting apparatus 13 is also used as a D/A converter, so that the number of independent D/A converters (5b in the conventional apparatus) can be reduced.

Although the embodiment has been described with respect to the serial/parallel type signal converting apparatus, the invention is not limited to such a type but can be also applied to other various kinds of signal converting apparatuses having A/D converters and D/A converters.

As described above, according to the embodiment, the number of D/A converters can be reduced and when the signal converting apparatus according to the invention is integrated. As a result, the chip size, electric power consumption, and costs can be reduced.

What is claimed is:

1. A signal converting apparatus receiving an input signal, comprising:
   converting means, including an analog-digital converting section and a digital-analog converting section, for performing an A/D conversion of the received input signal by using both analog-digital converting section and the digital-analog converting section; and
   switching means, coupled to the converting means, for switching between and A/D conversion operation an a D/A conversion operation of said converting means by switching over an input of said digital-analog converting section between an output of said analog-digital converting section and an external input,
   wherein a D/A conversion characteristic of said digital-analog converting section changes in response to the switching operation of said switching means.

2. An apparatus according to claim 1, wherein analog-digital converting section includes a first A/D converting unit to A/D convert an input signal of the analog-digital converting section into upper a bits and a second A/D converting unit to A/D convert an input signal of the analog-digital converting section into lower b bits.

3. An apparatus according to claim 2, wherein the input signal of the second A/D converting unit includes a difference between the input signal of the first A/D converting unit and a signal which is provided by D/A converting an output of said first A/D converting unit.

4. An apparatus according to claim 1, wherein the D/A converting section includes means for selectively executing an a bits D/A conversion or an (a+b) bits D/A conversion.

5. A signal converting apparatus which has a D/A converter and a plurality of A/D converters, for performing A/D conversion or D/A conversion of an input signal to output a conversion signal, wherein an input of the D/A converter can be selectively switched to either a conversion output of a predetermined one of said A/D converters or an external input, and when the input of the D/A converter is switched to the conversion output, the conversion output of the D/A converter is supplied to an input side of another one of said A/D converters, and when the input of the D/A converter is switched to the external input, the conversion output of the D/A converter is generated through an output terminal of the signal converting apparatus.

6. An apparatus according to claim 5, wherein the A/D converter includes a first A/D converting unit to A/D convert an input signal of the A/D converting section into upper a bits; and a second A/D converting unit to A/D convert an input signal of the A/D converter into lower b bits.

7. An apparatus according to claim 5, wherein the D/A converting section includes a converter which can selectively execute an a bits D/A conversion or an (a+b) bits D/A conversion.

8. A signal converting apparatus, comprising:

two A/D converters for A/D converting in parallel an input signal into upper bits and lower bits, respectively;

a D/A converter for generating a conversion output and outputting the conversion output to either an output terminal of the signal converting apparatus or an input side of one of said A/D converters; and switching means for selectively switching an input of the D/A converter to either a conversion output of the other A/D converter or an external input.

9. An apparatus according to claim 3, wherein a quantization level of the D/A converter is switched to either the sum of said upper and lower bits or the upper bits, depending on which input of the D/A converter is selected by said switching means.

10. A signal converting apparatus for A/D converting an input analog signal and D/A converting an input digital signal, comprising:

(a) a first A/D converter to A/D convert the input analog signal into a bits;

(b) a second A/D converter to A/D convert the input analog signal into b bits;

(c) a D/A converter to D/A convert either an output of the first A/D converter or the input digital signal; and (d) differential signal producing means for producing a difference between the input signal and an output of the D/A converter and supplying the difference as an input to the second A/D converter.

11. An apparatus according to claim 10, wherein said differential signal producing means includes a differential amplifier.

12. An apparatus according to claim 10, further having switching means for selectively switching the input of the D/A converter to either the output of the first A/D converter of a bits or the input signal of (a+b) bits.

* * * * *

UNITED STATES PATENT AND TRADEMARK OFFICE
CERTIFICATE OF CORRECTION

PATENT NO. : 5,404,141
DATED : April 4, 1995
INVENTOR(S) : Ohara

It is certified that error appears in the above-identified patent and that said Letters Patent is hereby corrected as shown below:

Title page,
Item [56], ABSTRACT,
Line 8, "operation" should read -- operation, --.

Column 2,
Line 26, "converters, and" should read -- converters. --;
Line 27, "when" should read -- When --;
Line 49, "and" should read -- and other --; and
Line 62, "EMBODIMENTS" should read -- EMBODIMENT --.

Column 3,
Line 39, "signal is" should read -- signal --; and
Line 55, "serial/paralled" should read -- serial/parallel --.

Column 4,
Line 25, "serial/paralled" should read -- serial/parallel --.
Line 31, "and" should be deleted;
Line 41, "both" should read -- both the --;
Line 45, "and" should read -- an --;
Line 46, "an" should read -- and --; and
Line 55, "wherein" should read -- wherein the --.

Column 6,
Line 6, "claim 3," should read -- claim 8, --.

Signed and Sealed this

Fifteenth Day of November, 2005

JON W. DUDAS
*Director of the United States Patent and Trademark Office*